United States Patent
Lin et al.

(10) Patent No.: US 6,437,575 B1
(45) Date of Patent: Aug. 20, 2002

(54) LOW-VOLTAGE DETECTING CIRCUIT

(76) Inventors: Hwan-Rong Lin, No. 72, MouTan Ln., ShaoAn Li LuKang Town, ChangHua; Huang-Hsiao Kao, 10F-2, No. 198, ChangAn St., LuChou; Hung-Chang Hsu, 11F, No.4, Aly.8, Ln.56, ChungLung St., HsinChuang, both of Taipei, all of (TW)

( * ) Notice: Subject to any disclaimer, the term of this patent is extended or adjusted under 35 U.S.C. 154(b) by 0 days.

(21) Appl. No.: 09/577,781

(22) Filed: May 24, 2000

(30) Foreign Application Priority Data

May 25, 1999 (TW) .......................... 88109239 A

(51) Int. Cl.$^7$ ...................... G01N 27/416; G01R 27/26; G08B 21/00
(52) U.S. Cl. ...................... 324/433; 324/428; 324/678; 324/711; 340/636; 340/663
(58) Field of Search .................. 324/433, 428, 324/677, 678, 711; 340/635, 636, 660, 663

(56) References Cited

U.S. PATENT DOCUMENTS 5,099,209 A * 3/1992 Seki et al. ............... 324/428
5,479,103 A * 12/1995 Kernahan et al. ........ 324/433

* cited by examiner

*Primary Examiner*—N. Le
*Assistant Examiner*—Anjan K. Deb

(57) ABSTRACT

A low-voltage detecting circuit for power sources is based upon the relation of the discharge time of a capacitor and the measured voltage value to determine whether the voltage level of the power source is too low. The voltage detecting circuit comprises a charge/discharge module and a discharge detecting module, wherein one terminal of said charge/discharge module is connected to the voltage to be measured. The discharge time of capacitor depends on the voltage to be measured. In other words, the voltage to be measured can be detected by calculating the discharge time of capacitor. Furthermore, the present invention provides a simplified circuit so as to reduce the fabrication cost.

10 Claims, 5 Drawing Sheets

LOW-VOLTAGE DETECTING CIRCUIT

BACKGROUND OF THE INVENTION

1. Field of the Invention

The present invention generally relates to a low-voltage detecting circuit for detecting the low-voltage state of power sources, and more particularly, to a low-voltage detecting circuit for determining whether the measured voltage value is insufficient by detecting the discharge time of a capacitor.

2. Description of the Prior Art

It has been an essential issue and technique in the field of electrical/electronic engineering to determine whether the power source of a circuit device or the electromotive force of a battery is in a loaded state. Especially in the recent years, the wireless electronic devices, such as cellular phones and wireless keyboards, have been widely used in commercial applications. Consequently, batteries necessarily serve as the sources to provide the needed power. When the user uses a battery as the power source for a wireless electronic device, it is important to determine whether the electromotive force of a battery is sufficient, so as to remind the user of replacing a new battery. Accordingly, there is a need for a low-voltage detecting circuit for detecting the state of a battery.

To date, the voltage detection precision is 0.1V in the prior art for the imported CMOS-based low-voltage detecting circuits. The disadvantage of such low-voltage detecting circuits is that such circuits generally dissipate a large current as 1~2μA (3V). Furthermore, the price is high because the market is monopolized. Therefore, there exists a need for providing a cheaper and simplified technique for the implementation of a low-voltage detecting circuit for use in wireless devices.

The prior art technique can be exemplified by, for example, U.S. Pat. No. 5,838,173 "Device and method for detecting a low-voltage in a system," as shown in FIG. 1, wherein the conventional circuit includes an oscillator 9 connected to a low-voltage detecting signal generator 19 to output a waveform according to the variation in the transconductance of transistors. The oscillator 9 generates a rectangular waveform and the number of the pulses in the waveform is proportional to the voltage level of the power source, and then is counted by the counter register 29 in the low-voltage detecting signal generator 19, which is used to generate a low-voltage detecting signal in response to the output of the oscillator 9. As the source voltage Vcc gets higher, the number of the pulses is increased in a constant period and the frequency of the waveform is also increased. Finally, the voltage level of the power source can be detected by being compared to a reference value.

The problem according to the conventional low-voltage detecting circuit is that the current dissipation exists even when the detecting circuit is not in its detecting operation. Furthermore, the fact that the circuit design in the conventional detecting circuit utilizes a great amount of electronic elements results in a increased fabrication cost. Accordingly, the conventional low-voltage detecting circuit is complex, expensive, power dissipating, and required to be improved.

SUMMARY OF THE INVENTION

In order to overcome the above problem, the present invention provides a low-voltage detecting circuit for power sources to reduce the cost of the circuit, simplify the circuit design, and further eliminate the power dissipation for power saving. The principle of the present invention is based upon the relation of the discharge time of a capacitor and the measured voltage value to determine whether the voltage level of the power source is too low.

Accordingly, it is a primary object of the present invention to provide a low-voltage detecting circuit for power sources to detect the low-voltage state and determine whether the electromotive force is sufficient to further provide a simplified detecting circuit able to detect the low-voltage state, resulting in a reduced fabrication cost.

Moreover, it is another object of the present invention to provide a low-voltage detecting circuit for power sources to reduce the power dissipation by eliminating current dissipation when the detecting circuit is not in its detecting operation.

The present invention is characterized in being based upon the formula of the discharge time of a capacitor, which can be expressed as:

$$V(t)=V_b e^{-t/RC} \tag{1}$$

Wherein Vb indicates the voltage value of the power sources to be measured, and V(t) is the voltage of the capacitor in the discharge process. The values of the resistor and the capacitor are fixed during the process within which the V(t) discharges to a constant voltage Va, and the amount of the discharge time can be expressed as:

$$t = RC \ln \frac{V_b}{V_a} \tag{2}$$

The formula (2) is the basic principle used in the present invention to detect the voltage value of the power source by calculating the discharge time. For example, when the voltage value decreases from 3.2V to 2.7V, the detecting circuit outputs a signal or drives a light emitting diode (LED) to remind the user to replace the power source.

In order to accomplish the foregoing objects, the present invention provides a low-voltage detecting circuit, comprising: a switching module; a charge/discharge module, connected to said switching module to execute charging operation or discharging operation by grounding under the control of said switching module; a discharge detecting module, connected to said charge/discharge module to output an informing signal when said charge/discharge module discharges to a first pre-determined voltage.

It is preferable that the present invention provides a low-voltage detecting circuit, further comprising: a control module including a timer, wherein said control module is connected to said switching module and said discharge detecting module.

The operation of said low-voltage detecting circuit includes the following steps:

(a) Said control module outputs a first control signal to said switching module to drive said charge/discharge module to execute charging operation.

(b) After a pre-determined period, said control module resets said timer to zero and activate said timer; meanwhile, said control module outputs a second control signal to said switching module to drive said charge/discharge module to execute discharging operation.

(c) When said charge/discharge module discharges to a first pre-determined voltage, said discharge detecting module outputs a first signal to said control module to stop the timing calculating of said timer and outputs a calculated value.

(d) The calculated value is compared to a pre-determined value.

(e) After (a) to (d) being repeated until the calculated value reaches the pre-determined value, said control module outputs an informing signal.

It is preferable that the present invention further provides a method for detecting the low-voltage state for power sources, comprising the steps of:

(a) generating a voltage across the capacitor equal to that of the power source;

(b) discharging the capacitor by grounding and activating a timer simultaneously;

(c) stopping the timer when the capacitor discharges to a first pre-determined voltage; and (d) comparing the ;calculated value from the timer to a pre-determined value, and outputting an informing signal when the calculated value reaches the pre-determined value.

It is preferable that the present invention provides a low-voltage detecting circuit that can serve as a low-voltage detecting circuit for the power source used in cellular phones when said low-voltage detecting circuit is implemented together with a micro-controller of cellular phones and an LED-based circuit to calculate the discharge time of the capacitor.

It is preferable that the present invention provides a low-voltage detecting circuit that can serve as a low-voltage detecting circuit for the power source used in wireless keyboards when said low-voltage detecting circuit is implemented together with a controller of wireless keyboards and an LED-based circuit to calculate We discharge time of the capacitor.

BRIEF DESCRIPTION OF THE DRAWINGS

The objects, spirits and advantages of the preferred embodiment of the present invention will be readily understood by the accompanying drawings and detailed descriptions, wherein.

Figure 4:
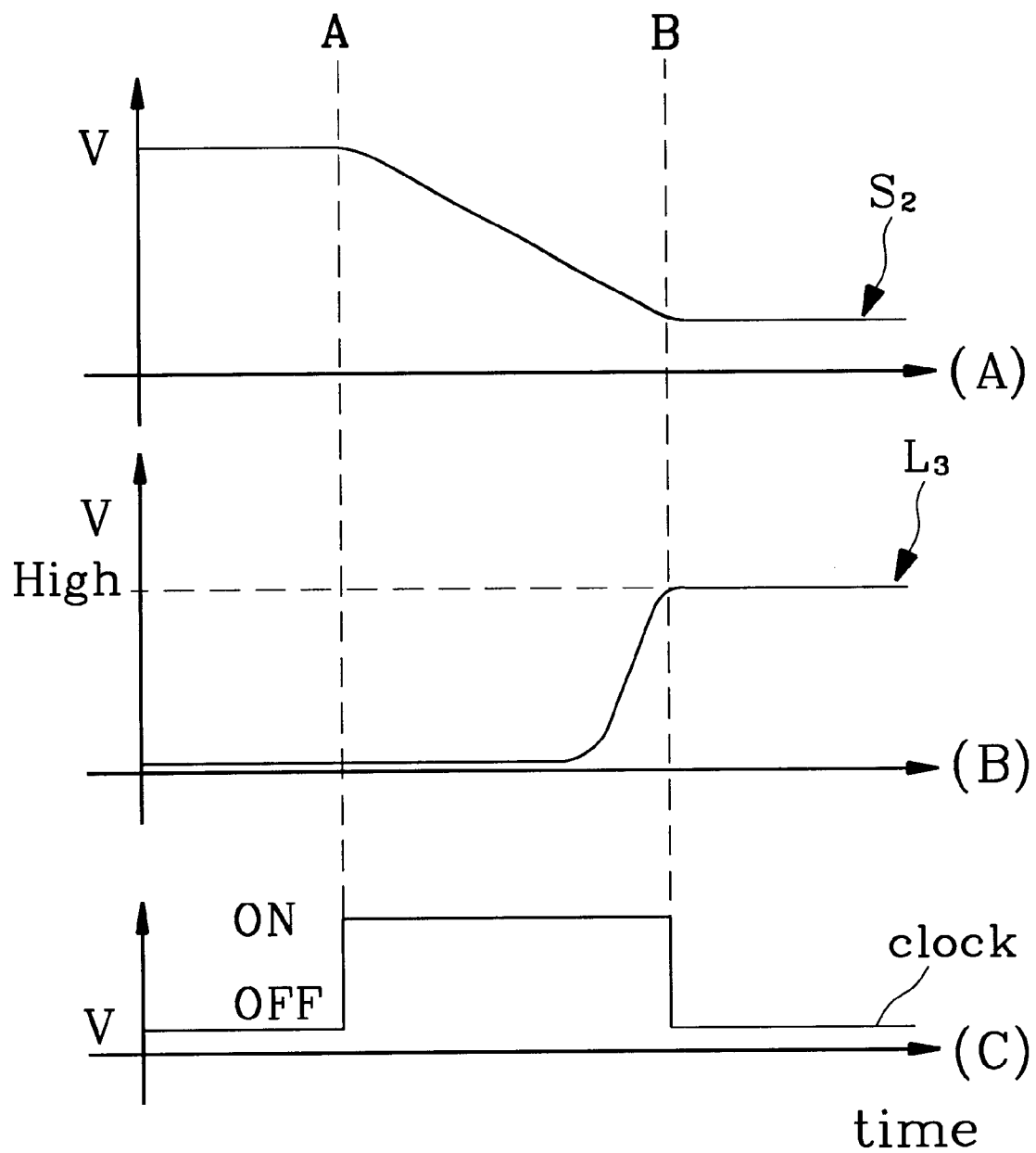
Figure 5:
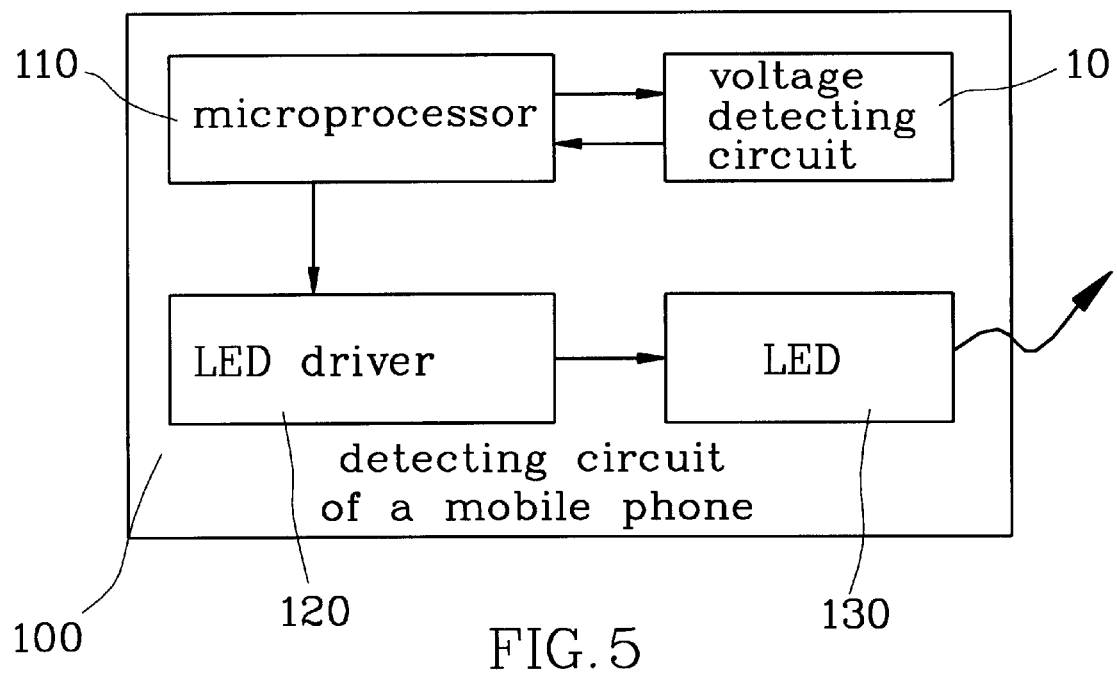
Figure 6:
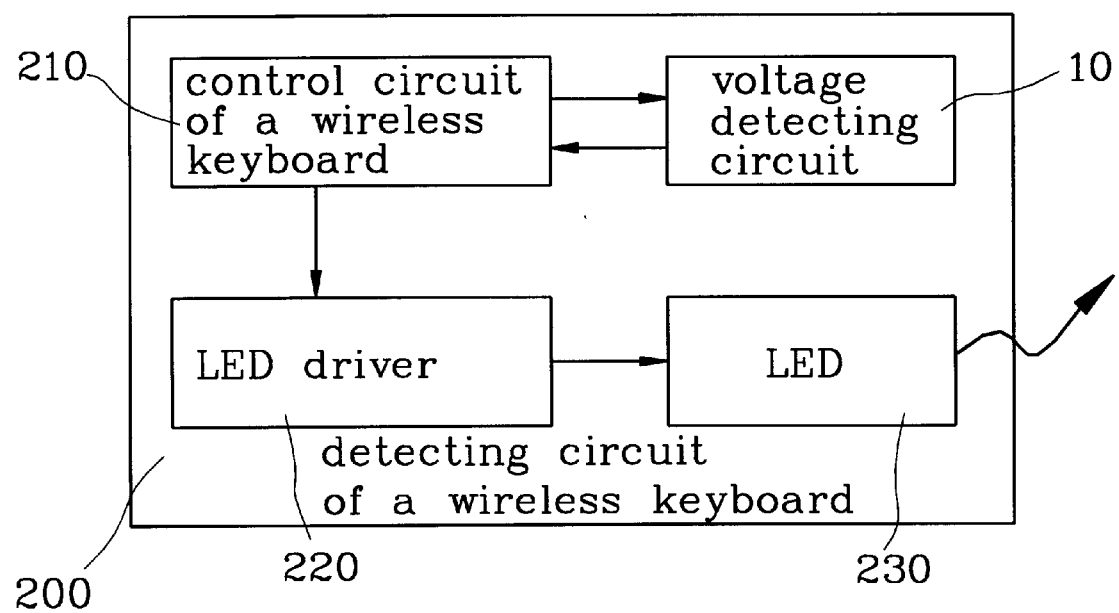

FIG. is a schematic circuit diagram of the second embodiment of a low-voltage detecting circuit for power sources controlled by a CPU for power sources according to the present invention;

FIG. 4 is a schematic illustration of the voltage waveform at points S2, L3 and the clock versus the time;

FIG. 5 is a circuit diagram of the third embodiment of a low-voltage detecting circuit for power sources applied to a cellular phone circuit; and FIG. 6 is a circuit diagram of the fourth embodiment of a low-voltage detecting circuit for power sources applied to a wireless keyboard circuit.

DETAILED DESCRIPTION OF THE INVENTION

The present invention provides a low-voltage detecting circuit for power sources based upon the relation of the discharge time of a capacitor and the measured voltage value to determine whether the voltage level of the power source is too low. Moreover, the present invention provides a low-voltage detecting circuit for power sources to reduce the fabrication cost. The power source can be a battery source used in cellular phones, wireless keyboards and wireless mice, therefore the present invention can be applicable to the computer peripheral devices.

Figure 1:
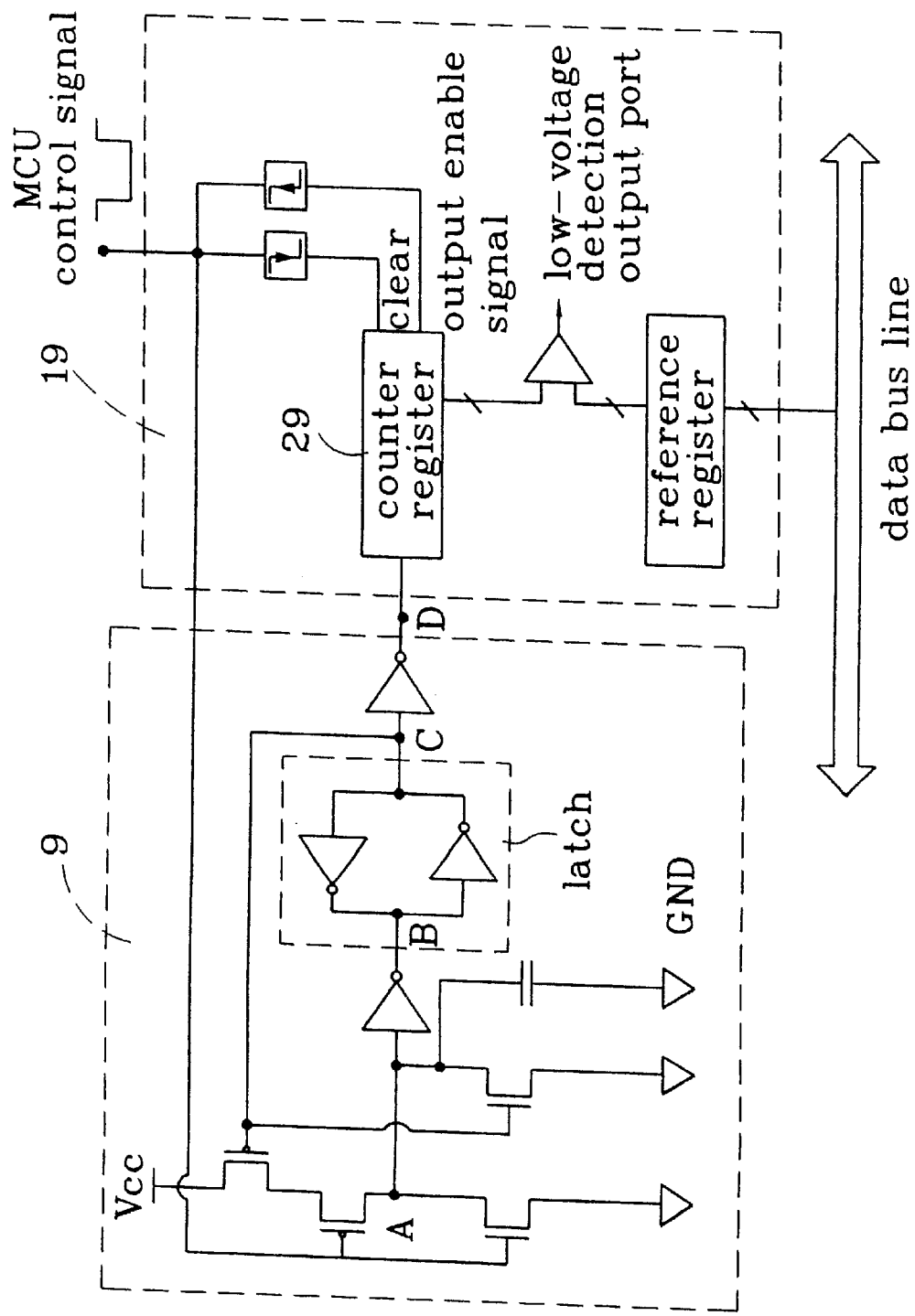
FIG. 1 is a schematic circuit diagram of the prior art of the conventional device and method for detecting a low-voltage detecting signal in a system.
Figure 2:
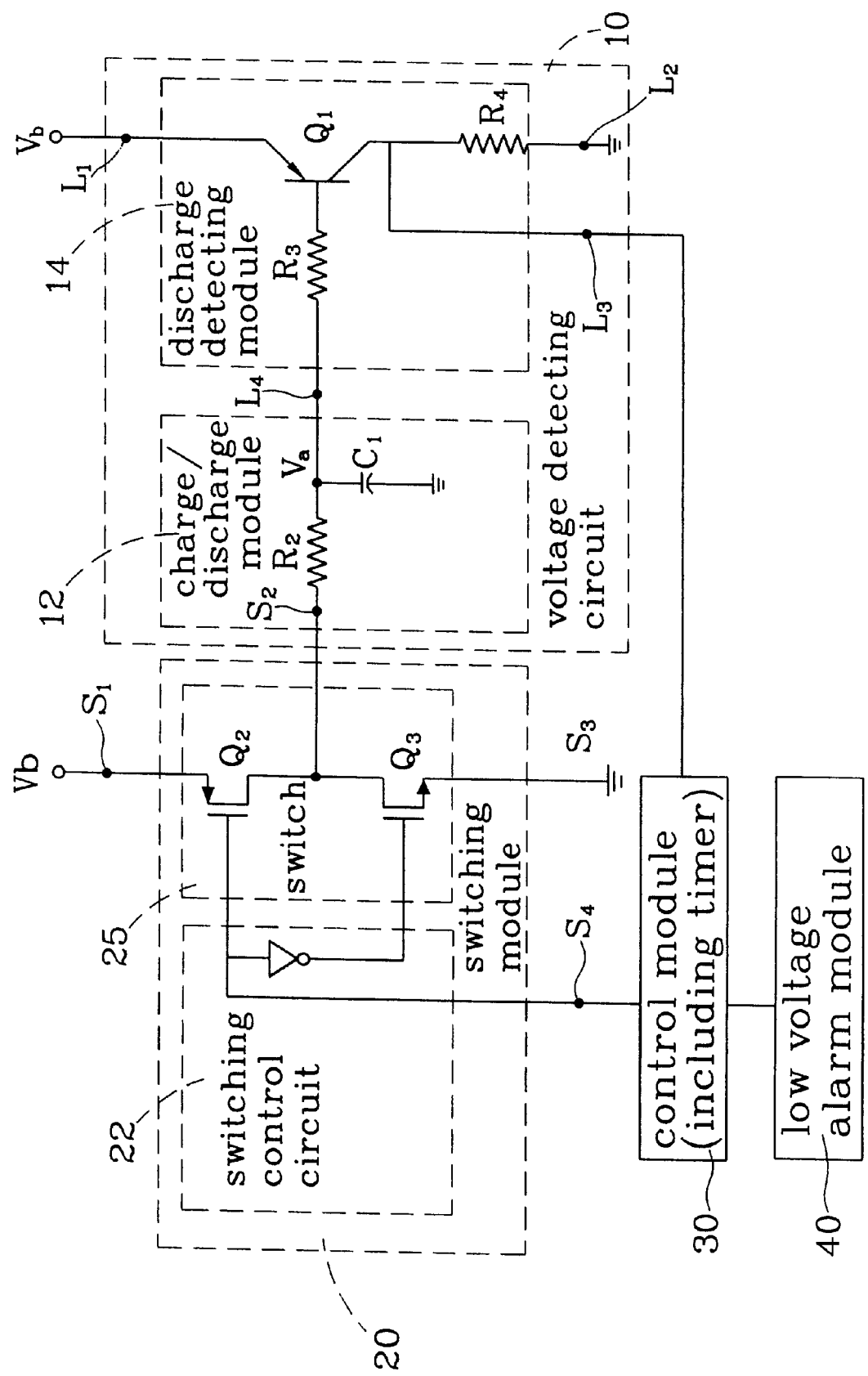
FIG. 2 is a schematic circuit diagram of the first embodiment of a low-voltage detecting circuit for power sources according to the present invention.

Please refer to FIG. 2, wherein there is shown the first embodiment of a low-voltage detecting circuit for power sources according to the present invention. The low-voltage detecting circuit comprises a voltage detecting circuit 10, serving the main voltage detecting circuit for power sources. Said voltage detecting circuit 10 includes a charge/discharge module 12 and a discharge detecting module 14, wherein said charge/discharge module 12 is connected to a switching module 20 to execute charging operation or discharging operation by grounding under the control of said switching module 20, and said discharge detecting module 14 is connected to said charge/discharge module 12 to output an informing signal through L3 when said charge/discharge module 12 discharges to a first pre-determined voltage.

Furthermore, as shown in FIG. 2, said switching module 20 comprises a switching control circuit 22 and a switch 25, wherein said switch 25 consists of two transistors Q2 and Q3 and can determine S2 to be charged or to be grounded. One of the terminals of said switch 25 (S1) is connected to a voltage to be measured Vb, and the gate terminal of said two transistors Q2 and Q3 connected to said switching control circuit 22 so as to drive said switch 25. In other words, the switching operations of said two transistors Q2 and Q3 are controlled by said switching control circuit 22, To be more specific, one of the terminals of said charge/discharge module 12 (S2) is connected to said switch 25 of said switching module 20, and one of the terminals of said switch 25 (S1) is connected to a voltage to be measured Vb. The discharge time of capacitor C1 depends on the voltage to be measured Vb. In other words, the voltage to be measured Vb can be detected by calculating the discharge time of capacitor C1. It is preferable that said discharge detecting module 14 consists of a PNP bipolar junction transistor (BJT) Q1 connected with a resistor R3 and R4.

As shown in FIG. 2, said switching module 20 is further connected to a control module 30 which including a timer connected to said switching module 20 at one terminal S4 and connected to said discharge detecting module 14 at another terminal L3.

The operation of said low-voltage detecting circuit includes the following steps:

(a) Said control module 30 outputs a first control signal to said switching module 20 to drive said charge/discharge module 12 to turn on Q2 and turn off Q3 and thus execute charging operation.

(b) After a pre-determined period, said control module 30 resets said timer to zero and activate said timer; meanwhile, said control module 30 outputs a second control signal to said switching module 20 to drive said charge/discharge module 12 to turn off Q2 and execute discharging operation.

(c) When said charge/discharge module 12 discharges to a first predetermined voltage, Q1 of said discharge detecting module 14 is activated and outputs a first signal to said control module 30 to stop the timing calculating of said timer and outputs a calculated value.

(d) The calculated value is compared to a pre-determined value.

(e) After (a) to (d) being repeated until the calculated value becomes equal to or less than the pre-determined value, said control module 30 outputs an informing signal.

Through the above procedures, the discharge control and voltage detection of said control module 30 can be completed. Furthermore, as shown in FIG. 2, said control module 30 further comprises a low-voltage informing module 40 connected to it to output an alarm signal when the calculated value reaches a pre-determined value and said control module 30 outputs a second signal to said low-voltage informing module 40.

The present invention further provides a method for detecting the low-voltage state for power sources, comprising the steps of:

(a) generating a voltage across the capacitor equal to that of the power source;

(b) discharging the capacitor by grounding and activating a timer;

(c) stopping the timer when the capacitor discharges to a first pre-determined voltage; and (d) comparing the calculated value from the timer to a pre-determined value, and outputting an informing signal when the calculated value reaches the pre-determined value.

In such manner, a method for detecting the low-voltage state for power sources can be completed and applicable to detecting the low-voltage state of the power source for cellular phones or wireless keyboards.

Figure 3:
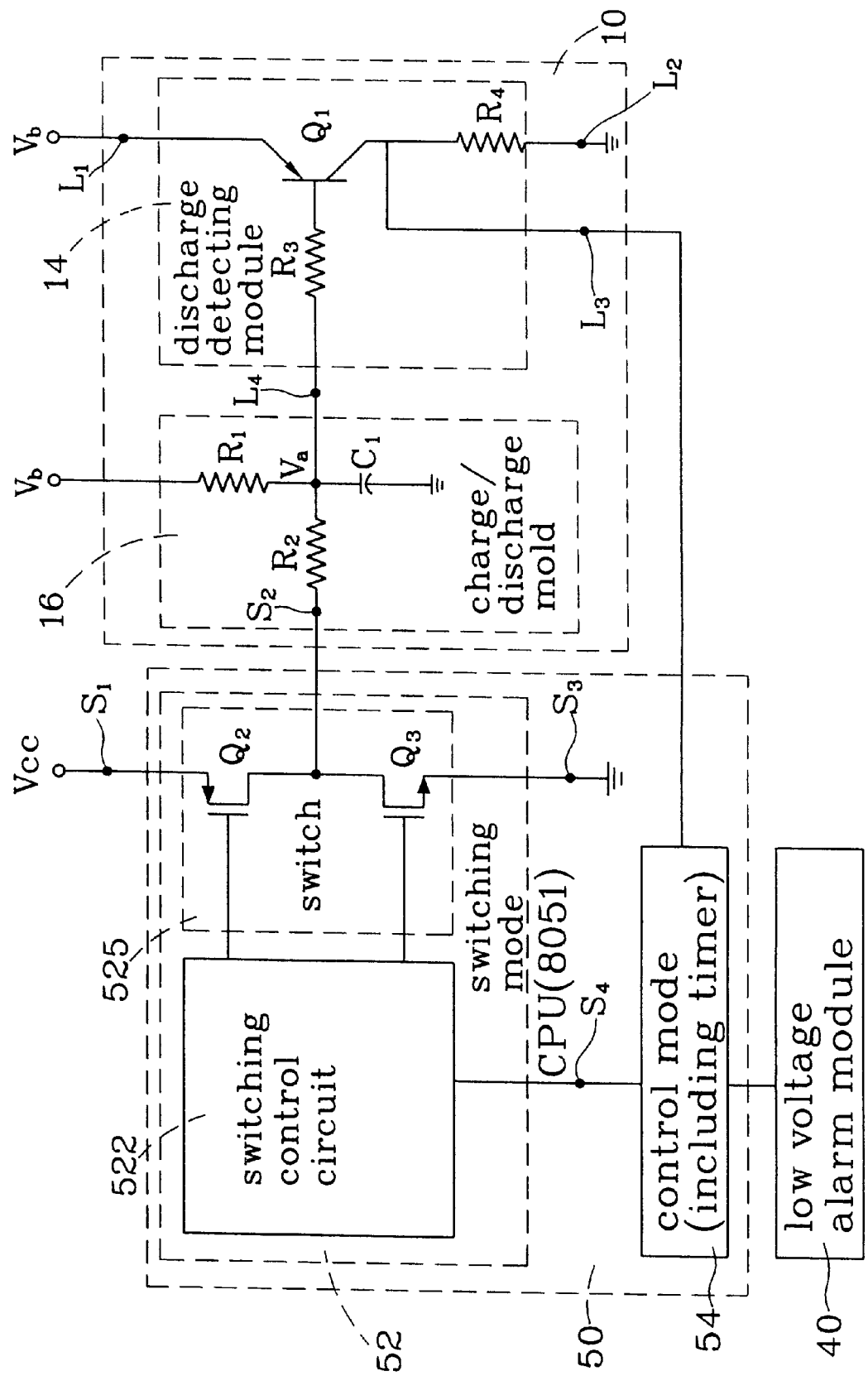

Please refer to FIG. 3, which is a schematic circuit diagram of the second embodiment of a low-voltage detecting circuit for power sources controlled by a CPU according to the present invention. As shown in FIG. 3, said voltage detecting circuit 10 is connected to a central process unit (CPU) 50. In other words, both of said switching module 20 and said control module 30 of the first embodiment in FIG. 2 are replaced by a CPU 50. In addition, the implementation of the charge/discharge module 16 in FIG. 3 is different from that of said charge/discharge module 12 in FIG. 2. As shown in FIG. 3, the charge/discharge module 16 further includes a resistor R1 connected to C1 and R2 at Va, wherein R1 is further connected to the voltage to be measured Vb at the other terminal. The resistance value of R1 should be much larger than that of R2.

Furthermore, said CPU 50 can be implemented by using a single chip micro-controller 8051 to determine S2 to be floating or grounded. Similarly, said CPU 50 of the second embodiment comprises a switching module 52 and a control module 54, wherein said switching module 52 include a switching control circuit 522 and a switch 525. The procedures for describing the discharge control and voltage detection of said CPU in associate with said voltage detecting circuit 10 are the same as in the first embodiment, and therefore is omitted for clarity. In addition, said low-voltage informing module 40 of the second embodiment is the same as that of the first embodiment.

Accordingly, the present invention is characterized in calculating the discharge time of capacitor C1 by using said voltage detecting circuit 10, said switching module 20 or 52, and said control module 30 or 54 according to the first or second embodiment, and consequently the voltage state and the electromotive force of the power source can be determined. We refer to the formula (1) of the discharge time of the capacitor C1, which can be expressed as:

$$V(t) = V_b e^{-t/RC} \quad (1)$$

wherein Vb indicates the voltage value of the power sources to be measured, and V(t) is the voltage of the capacitor in the discharge process. The values of the resistor and the capacitor are fixed during the process within which the V(t) discharges to a constant voltage Va, and the amount of the discharge time can be expressed as:

$$t = RC \ln \frac{V_b}{V_a} \quad (2)$$

The formula (2) is the basic principle used in the present invention to detect the voltage value of the power source by calculating the discharge time. For example X when the voltage value decreases from 3.2V to 2.7V, the detecting circuit outputs a signal to drive a light emitting diode (LED) to remind the user to replace the power source.

In order to make the present invention more understood, FIG. 4 shows the voltage waveform at the terminals S2, L3 and the clock versus the time, wherein FIG. 4A shows the timing diagram indicating that the capacitor discharges with respect the signal at S2 changes from HIGH to LOW, FIG. 4B shows the timing diagram with respect the signal at L3 changes from LOW to HIGH, and FIG. 4C shows the timing diagram of the switch of the timer. After the capacitor is charged to the voltage to be measured, at point A, the capacitor starts to discharge and activates the timer. The discharging process lasts until the value of Va reaches a first pre-determined value at point B. Meanwhile, the potential at point L3 is detected to change from LOW to HIGH, and then the timer is turned off. We may take an experiment for the present invention, if the battery voltage is, 3V, then we figure out the discharging time is 615µs. On the other condition, if the battery voltage is 2.72V, the capacitor C1 discharging time is 670µs. Therefore, it may be concluded that the discharging time is shorter if the battery voltage is higher. The relation can be confirmed through analyzing the formula (2). When the BJT Q1 is on, the terminal L3 is in high level, the voltage Va=Vb−0.9V, wherein we assume that R3=2M Ω, R4=50 kΩ and $h_{fe}$ of Q1 is 200. Then the formula (2) be amended as follow formula (3):

$$t = RC \ln \frac{V_b}{V_b - 0.9} \quad (3)$$

Accordingly, if the voltage Vb is higher, the value Vb/(Vb−0.9) is smaller, then the time t is shorter obviously.

The present invention can be applicable in the applications of cellular phones or wireless keyboards. Please refer to FIG. 5, which is a circuit diagram of the third embodiment of a low-voltage detecting circuit for power sources applied to a cellular phone circuit. Namely, said voltage detecting circuit 10 in FIG. 2 is used wit a low-voltage detecting circuit 100 for power sources applied to a mobile phone circuit. The voltage detecting circuit 10 is connected to a CPU 110 of the cellular phone circuit board. Said CPU 110 is connected to said voltage detecting circuit 10 to control the input terminal of said voltage detecting circuit 10 be floating or grounded and to calculate the charging/discharging time of the capacitor. Said voltage detecting circuit 10 has been described in the first and second embodiment, therefore we do not repeat its operation hereinafter. One output of said CPU 10 is coupled to an LED driver 120 to drive an LED 130 lighting. When the LED 130 is lighting, it means the battery voltage is in low level and needs to be recharged or changed. Furthermore, said CPU 110 of the cellular phone circuit board can be implemented by using a single chip controller, such as a 8051 single chip, which has already been used as a controller element in cellular phones. Therefore our circuit design only add a voltage detecting circuit 10 to the conventional circuit design of cellular phones.

Please refer to FIG. 6, which is a circuit diagram of the fourth embodiment of a low-voltage detecting circuit for power source applied to a wireless keyboard circuit.

Namely, said voltage detecting circuit 10 in FIG. 2 is used with a low-voltage detecting circuit 200 for power sources applied to a wireless keyboard circuit. The voltage detecting circuit 10 is connected to a keyboard controller 210 of the wireless keyboard circuit board. Said keyboard controller 210 is connected to said voltage detecting circuit 10 to control the input terminal of said voltage detecting circuit 10 be floating or grounded and to calculate the charging/discharging time of the capacitor. Said voltage detecting circuit 10 has been described in the first and second embodiment, therefore we do not repeat its operation hereinafter. One output of said keyboard controller 210 is coupled to an LED driver 220 to drive an LED 230 lighting. When the LED 230 is lighting, it means the battery voltage is in low level and needs to be recharged or changed. Furthermore, said keyboard controller 210 of the wireless keyboard circuit board can be implemented by using a single chip controller, such as a 8051 single chip, which has already been used as a controller element in wireless keyboards. Therefore, our circuit design only is add a voltage detecting circuit 10 to the conventional circuit design of wireless keyboards.

As discussed so far, in accordance with the present invention, there is provided a low-voltage detecting circuit for detecting the low-voltage state of power sources that can be applicable to the use in cellular phones and wireless keyboards without increasing fabrication cost. Consequently, the present invention has been examined to be progressive and has great potential in commercial applications.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A low-voltage detecting circuit for detecting the voltage level of power sources, comprising:
   a switching module;
   a charge/discharge module, connected to said switching module;
   a discharge detecting module, connected to said charge/discharge module; and
   a control module including a timer, wherein said control module is connected to said switching module and said discharge detecting module;
   wherein said control module outputs a first control signal to the switching module to drive said charge/discharge module to execute charging operation; after a pre-determined period, said control module resets said timer to zero and activate said timer, meanwhile, said control module outputs a second control signal to said switching module to drive said charge/discharge module to execute discharging operation; when said charge/discharge module discharges to a first pre-determined voltage, said discharge detecting module outputs a first signal to said control module to stop the timing calculating of said timer and outputs a calculated value; and then according to the calculated value to determine the voltage level of power sources.

2. The low-voltage detecting circuit for voltage sources as recited in claim 1, wherein said charge/discharge module includes a capacitor which has one end coupled to the ground and another end coupled to a first resistor and a second resistor.

3. The low-voltage detecting circuit for voltage sources as recited in claim 1, wherein said discharge detecting module includes a transistor coupled to a voltage source, a third resistor and a fourth resistor to output a detecting signal represented the voltage source level when said discharge module is discharging.

4. The low-voltage detecting circuit for voltage sources as recited in claim 1, further comprising a low-voltage informing module connected to said control module to output an alarm signal when the calculated value reaches a pre-determined value and said control module outputs a second signal to said low-voltage informing module.

5. A method of detecting the voltage level of voltage sources, comprising the steps of;:
   (a) generating a voltage across the capacitor equal to that of the power source;
   (b) discharging the capacitor by grounding and activating a timer;
   (c) stopping the timer when the capacitor discharges to a first pre-determined voltage; and
   (d) comparing the calculated value from the timer to a pre-determined value, and outputting an informing signal when the calculated value reaches the pre-determined value.

6. A low-voltage detecting circuit for voltage sources applicable to wireless keyboards or cellular phone, comprising:
   a voltage detecting circuit, including a charge/discharge module having an output coupled to a discharge detecting module and having an input coupled to a switching module, wherein said charge/discharge module charges a voltage to the voltage source level or discharge by grounding under the control of said switching module; wherein said discharge detecting module outputs a first signal informing that the voltage source is too low when the charge/discharge module discharge to a first pre-determined voltage level;
   a control circuit, connected to said voltage detecting circuit for controlling said input of the charge/discharge module of said voltage detecting circuit to be floating or grounded, and further calculating the amount of the charge or discharge time to determine the voltage level; and
   a light emitting diode (LED) driving circuit, connected to the CPU of cellular phones to drive an LED under the control of the CPU of cellular phones.

7. The low-voltage detecting circuit for voltage sources applicable to wireless keyboards or cellular phones as recited in claim 6, wherein said charge/discharge module of includes a capacitor having one end coupled to the ground and another end coupled to a first resistor and a second resistor to execute charging/discharging operation.

8. The low-voltage detecting circuit for voltage sources applicable to wireless keyboards or cellular phones as recited in claim 6, wherein said discharge detecting module includes a transistor coupled to a voltage source at one end, and connected to a third resistor and a fourth resistor, so as to output a detecting signal informing the voltage source level when said discharge module discharges.

9. The low-voltage detecting circuit for voltage sources applicable to wireless keyboards or cellular phones as recited in claim 6, wherein said control circuit is placed in a CPU of a mobile phone circuit so that said low-voltage detecting circuit for voltage sources can be applicable to the mobile phone battery detecting.

10. The low-voltage detecting circuit for voltage sources applicable to wireless keyboards or cellular phones as recited in claim 6, wherein said control circuit is placed in a wireless keyboard control circuit which is a single chip processor so that said low-voltage detecting circuit for a voltage source can be applied to the wireless keyboard battery detecting.

* * * * *